United States Patent
Shih

(10) Patent No.: US 11,449,806 B2
(45) Date of Patent: Sep. 20, 2022

(54) METHOD FOR PERFORMING MEMORY ACCESS MANAGEMENT WITH AID OF MACHINE LEARNING IN MEMORY DEVICE, ASSOCIATED MEMORY DEVICE AND CONTROLLER THEREOF, AND ASSOCIATED ELECTRONIC DEVICE

(71) Applicant: Silicon Motion Inc., Hsinchu County (TW)

(72) Inventor: Po-Yi Shih, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 893 days.

(21) Appl. No.: 16/271,889

(22) Filed: Feb. 11, 2019

(65) Prior Publication Data

US 2019/0347573 A1    Nov. 14, 2019

(30) Foreign Application Priority Data

May 14, 2018    (TW) .................................. 107116259

(51) Int. Cl.
  *G06N 20/00*    (2019.01)
  *G06N 20/10*    (2019.01)
  (Continued)

(52) U.S. Cl.
  CPC ........... *G06N 20/10* (2019.01); *G06F 3/0604* (2013.01); *G06F 3/0659* (2013.01);
  (Continued)

(58) Field of Classification Search
  CPC ..... G11C 16/26; G11C 16/0483; G11C 11/54; G11C 11/5642; G11C 29/028;
  (Continued)

(56) References Cited

U.S. PATENT DOCUMENTS 8,259,506 B1    9/2012    Sommer
8,467,249 B2    6/2013    Katz
(Continued)

FOREIGN PATENT DOCUMENTS

CN    102246241 A    11/2011
CN    106448737 A    2/2017
(Continued)

OTHER PUBLICATIONS

Cristian Zambelli et al., Characterization of TLC 3D-NAND Flash Endurance through Machine Learning for LDPC Code Rate Optimization, 2017 IEEE, 2017.

*Primary Examiner* — Thong Q Le
(74) *Attorney, Agent, or Firm* — Winston Hsu

(57) ABSTRACT

A method for performing memory access management with aid of machine learning in a memory device, the associated memory device and the controller thereof, and the associated electronic device are provided. The method may include: in the memory device, during a training phase, performing machine learning according to a predetermined database regarding threshold voltage distribution, to generate at least one threshold voltage identification model, wherein the at least one threshold voltage identification model is utilized for determining bit information read from a memory cell of the NV memory; and in the memory device, during an identification phase, obtaining representative information of one or more reference voltages when reading the NV memory, for performing machine identification according to the at least one threshold voltage identification model to generate read data, wherein the read data includes the bit information.

20 Claims, 5 Drawing Sheets

(51) Int. Cl.
*G11C 16/04* (2006.01)
*G11C 16/26* (2006.01)
*G11C 16/34* (2006.01)
*G06F 3/06* (2006.01)
*G11C 11/56* (2006.01)

(52) U.S. Cl.
CPC ........ *G06F 3/0679* (2013.01); *G11C 16/0483* (2013.01); *G11C 16/26* (2013.01); *G11C 16/3427* (2013.01); *G11C 11/5642* (2013.01); *G11C 11/5671* (2013.01)

(58) Field of Classification Search
CPC . G11C 13/004; G11C 29/021; G11C 11/5671; G11C 13/003; G11C 16/20; G11C 16/28; G11C 16/3427; G11C 2213/79; G11C 11/1673; G11C 11/5685; G11C 13/0028; G11C 16/10; G11C 11/1657; G11C 11/56; G11C 11/5607; G11C 11/5678; G11C 13/0004; G11C 13/0026; G11C 13/0069; G11C 2029/0403; G11C 2029/0409; G11C 2029/0411; G11C 2029/5004; G11C 29/04; G11C 29/44; G11C 29/50; G11C 29/50004; G11C 29/52; G11C 7/1006; G11C 11/34; G11C 16/32; G11C 16/3404; G11C 11/1659; G11C 11/1675; G11C 11/5614; G11C 13/0097; G11C 16/0408; G11C 16/16; G11C 16/34; G11C 2013/0045; G11C 2013/0078; G11C 2013/0092; G11C 2213/72; G11C 2213/74; G11C 2213/76; G11C 2213/82; G06N 3/063; G06N 3/08; G06N 3/04; G06N 3/0635; G06N 3/0454; G06N 3/0445; G06N 3/0481; G06N 3/0675; G06N 3/084; G06N 3/0472; G06N 7/005; G06N 20/00; G06N 20/10; G06N 3/10; G06F 17/16; G06F 3/0659; G06F 3/0679; G06F 17/14; G06F 3/0604; G06F 7/5443; G06F 11/008; G06F 11/0727; G06F 11/076; G06F 11/1072; G06F 11/1076; G06F 11/2257; G06F 11/2263; G06F 11/3409; G06F 2207/4824; G06F 3/0619; G06F 3/0634; G06F 3/0688; G06F 11/00; G06F 11/0751; G06F 11/0793; G06F 11/10; G06F 11/3034; G06F 11/3058; G06F 16/9032; G06F 16/90335; G06F 17/18; G06F 21/10; G06F 21/31; G06F 21/73

See application file for complete search history.

(56) References Cited

U.S. PATENT DOCUMENTS

| | | | |
|---|---|---|---|
| 2016/0148679 | A1 | 5/2016 | Yoshimoto |
| 2017/0083811 | A1 | 3/2017 | Cho |
| 2019/0172542 | A1* | 6/2019 | Miladinovic ....... G06F 11/0727 |

FOREIGN PATENT DOCUMENTS

| | | |
|---|---|---|
| CN | 106710631 A | 5/2017 |
| CN | 107240419 A | 10/2017 |
| CN | 107797935 A | 3/2018 |
| CN | 107957851 A | 4/2018 |
| CN | 107967928 A | 4/2018 |
| WO | 2014/113588 A1 | 7/2014 |

* cited by examiner

METHOD FOR PERFORMING MEMORY ACCESS MANAGEMENT WITH AID OF MACHINE LEARNING IN MEMORY DEVICE, ASSOCIATED MEMORY DEVICE AND CONTROLLER THEREOF, AND ASSOCIATED ELECTRONIC DEVICE

BACKGROUND OF THE INVENTION

1. Field of the Invention

The present invention relates to access of Flash memory, and more particularly, to a method for performing memory access management with aid of machine learning in a memory device, the associated memory device and controller thereof, and an associated electronic device.

2. Description of the Prior Art

Developments in memory technology have enabled the wide application of portable or non-portable memory devices (e.g. a memory card conforming to SD/MMC, CF, MS, XD or UFS specification, a solid state drive, an embedded storage device conforming to UFS or EMMC specification). Therefore, improving access control of memories in these memory devices remains an issue to be solved in the art.

NAND flash memories may comprise single level cell (SLC) and multiple level cell (MLC) flash memories. In an SLC flash memory, each transistor used as a memory cell may have either of two electrical charge values, which may represent logic values 0 and 1, respectively. In addition, the storage ability of each transistor used as a memory cell in an MLC flash memory may be fully utilized. The transistor in the MLC flash memory is driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in memory devices than an SLC flash memory. The MLC flash memory does have instability issues, however. To guarantee that access control of the flash memory in the memory devices meets related specifications, a controller of the flash memory is configured to apply management mechanisms for properly managing data access.

According to related art, the memory devices with the above management mechanisms still have certain deficiencies. For example, utilizing a newer architecture Flash memory (e.g. a Flash memory with newer architecture, such as 3D NAND Flash memory) to implement a memory device may increase the storage space of the memory device, and, after triple level cell (TLC) Flash memory, quadruple level cell (QLC) Flash memory may become the next research and development target. When trying to utilize these management mechanisms on the memory device equipped with the aforementioned newer architecture Flash memory, the threshold voltage of a read operation may easily become inaccurate, which may cause various problems, for example, reducing time of data retention, directly or indirectly, increasing probability of occurrence of read disturb errors, increasing the number of times of performing read retry of data, and increasing difficulty of Error Correction Code (ECC) decoding. Thus, there is a need for a novel method and associated architecture to enhance overall performance of memory devices without introducing side effects or in a way that is less likely to introduce side effects.

SUMMARY OF THE INVENTION

An object of the present invention is to provide a method for performing memory access management with aid of machine learning in a memory device, the associated memory device and controller thereof, and an associated electronic device, to solve the aforementioned problems.

Another objective of the present invention is to provide a method for performing memory access management with aid of machine learning in a memory device, the associated memory device and controller thereof, and an associated electronic device, to achieve optimal performance of the memory devices without introducing side effects or in a way that is less likely to introduce side effects.

At least one embodiment of the present invention provides a method for performing memory access management with aid of machine learning in a memory device, wherein the memory device comprises a non-volatile (NV) memory, and the NV memory comprises at least one NV memory element. The method may comprise: in the memory device, during a training phase, performing machine learning according to a predetermined database regarding a threshold voltage distribution, to generate at least one threshold voltage identification model, wherein the at least one threshold voltage identification model is utilized for determining bit information read from a memory cell of the NV memory; and in the memory device, during an identification phase, obtaining representative information of one or more reference voltages when reading the NV memory, for performing machine identification according to the at least one threshold voltage identification model to generate read data, wherein the read data comprises the bit information.

At least one embodiment of the present invention provides a memory device that may comprise: a non-volatile (NV) memory, arranged to store information, wherein the NV memory comprises at least one NV memory element; and a controller, coupled to the NV memory, arranged to control at least one operation of the memory device. The controller may comprise a processing circuit. For example, the processing circuit may control the controller according to a command from a host device, to allow the host device to access the NV memory through the controller. In addition, during a training phase, the controller performs machine learning according to a predetermined database regarding a threshold voltage distribution, to generate at least one threshold voltage identification model, wherein the at least one threshold voltage identification model is utilized for determining bit information read from a memory cell of the NV memory. Additionally, during an identification phase, the controller obtains representative information of one or more reference voltages when reading the NV memory, for performing machine identification according to the at least one threshold voltage identification model to generate read data, wherein the read data comprises the bit information.

According to some embodiments, the present invention further provides an electronic device that may comprise the aforementioned memory device and further comprise: the host device, coupled to the memory device. The host device may comprise: at least one processor, arranged to control operations of the host device; and a power supply circuit, coupled to the at least one processor, arranged to provide power to the at least one processor and the memory device.

In addition, the memory device may be arranged to provide the host device with storage space.

At least one embodiment of the present invention provides a controller of a memory device, wherein the memory device comprises the controller and a non-volatile (NV) memory, and the NV memory comprises at least one NV memory element. The controller may comprise a processing circuit. For example, the processing circuit may control the controller according to a command from a host device, to allow the host device to access the NV memory through the controller. In addition, during a training phase, the controller performs machine learning according to a predetermined database regarding a threshold voltage distribution, to generate at least one threshold voltage identification model, wherein the at least one threshold voltage identification model is utilized for determining bit information read from a memory cell of the NV memory. Additionally, during an identification phase, the controller obtains representative information of one or more reference voltages when reading the NV memory, for performing machine identification according to the at least one threshold voltage identification model to generate read data, wherein the read data comprises the bit information.

One of advantages of the present invention is that the present invention can perform proper control regarding operations of the memory device, and more particularly, accuracy of threshold voltages for read operations can be improved in order to prevent various problems in the related arts. In addition, implementing according to the embodiments of the present invention will not greatly increase additional costs. Thus, problems existing in the related arts can be solved without greatly increasing the overall cost. In comparison with the related arts, the present invention can enhance performance of memory devices without introducing side effects or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
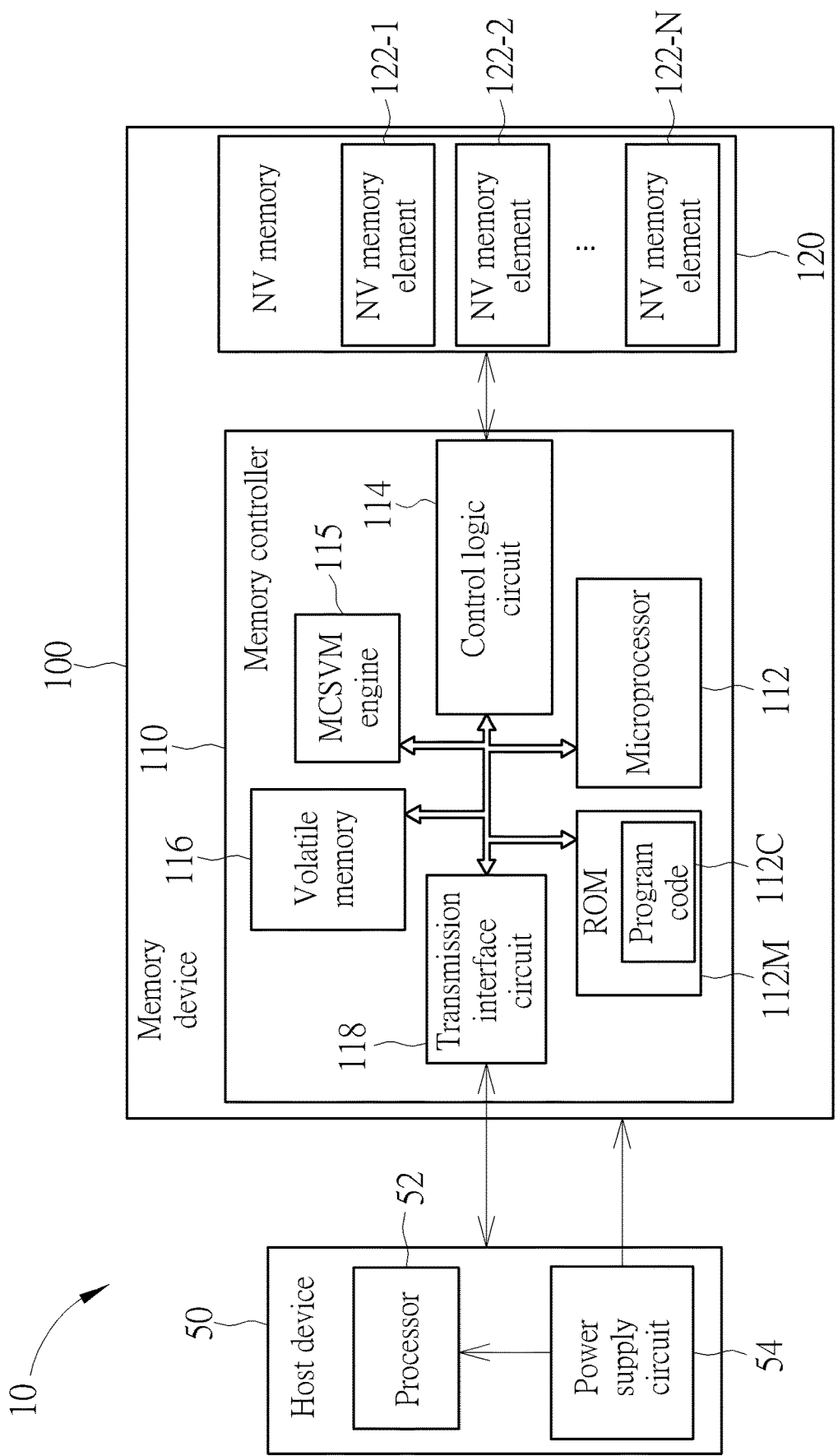
FIG. 1 is a diagram illustrating an electronic device according to an embodiment of the present invention.

FIG. 1 is a diagram illustrating an electronic device 10 according to an embodiment of the present invention, where the electronic device 10 comprises a host device 50 and a memory device 100. The host device 50 may comprise: at least one processor 52 (e.g. one or more processor), arranged to control operations of the host device 50; and a power supply circuit 54, coupled to the aforementioned at least one processor 52, arranged to provide power to the aforementioned at least one processor 52 and the memory device 100, and provide one or more driving voltages to the memory device 100, where the memory device 100 may be arranged to provide the host device 50 with storage space, and may obtain the one or more driving voltages from the host device 50 to be power of the memory device 100. Examples of the host device 50 may include, but are not limited to: a multifunctional mobile phone, a tablet computer, a wearable device, and a personal computer such as a desktop computer and a laptop computer. Examples of the memory device 100 may include, but are not limited to: a portable memory device (such as a memory card conforming to SD/MMC, CF, MS, XD or UFS specifications), a solid state drive (SSD) and various embedded storage device (such as an embedded storage device conforming to UFS or EMMC specifications) . According to this embodiment, the memory device 100 may comprise a controller such as a memory controller 110, and may further comprise a non-volatile (NV) memory 120, where the controller is arranged to access the NV memory 120, and the NV memory 120 is arranged to store information. The NV memory 120 may comprise at least one NV memory element (e.g. one or more NV memory elements), such as a plurality of NV memory elements 122-1, 122-2, . . . , and 122-N, where "N" may represent an integer greater than 1. For example, the NV memory 120 may be a Flash memory, and the NV memory elements 122-1, 122-2, . . . , and 122-N may be a plurality of Flash memory chips (which may be referred to as Flash chips) or a plurality of Flash memory dies (which may be referred to as Flash dies), respectively, but the present invention is not limited thereto.

As shown in FIG. 1, the memory controller 110 may comprise a processing circuit such as a microprocessor 112, a storage component such as a Read Only Memory (ROM) 112M, a control logic circuit 114, a Multi-Class Support Vector Machine (MCSVM) engine 115, a volatile memory 116 and a transmission interface circuit 118, where at least one portion (e.g. a portion or all) of these components may be coupled to one another through a bus. The MCSVM engine 115 may comprise multiple data processing sub-circuit, such as multiple calculation cells corresponding to various calculation operations, for performing related learning and identification operations, and the volatile memory 116 is implemented by a Random Access Memory (RAM), for example, the volatile memory 116 may be a Static RAM (SRAM), but the present invention is not limited thereto. The volatile memory 116 may be arranged to provide internal storage space to the memory controller 110, for example, temporarily storing information. In addition, the ROM 112M of this embodiment is arranged to store a program code 112C, and the microprocessor 112 is arranged to execute the program code 112C to control access of the NV memory 120. Please note that, the program code 112C may be stored in the volatile memory 116 or any type of memory. Additionally, the control logic circuit 114 may be arranged to control the NV memory 120. The control logic circuit 114 may comprise an Error Correction Code (ECC) circuit (not shown), to perform data protection and/or error correction, but the present invention is not limited thereto. The transmission interface circuit 118 may conform to a specific communications specification (such as Serial Advanced Technology Attachment (SATA) specification, Universal Serial Bus (USB) specification, Peripheral Component Interconnect Express (PCIE) specification, embedded Multi Media Card (eMMC) specification, or Universal Flash Storage (UFS) specification) and may perform communications according to the specific communications specification.

In this embodiment, the host device 50 may access the memory device 100, indirectly, through transmitting host commands and corresponding logic addresses to the memory controller 110. The memory controller 110 receives the host commands and the logic addresses, and translates the host commands to memory operation commands (which may be referred to as operation commands), and further controls the NV memory 120 with the operation commands to perform reading or writing/programing upon memory units or data pages having physical addresses within the flash memory 120, where the physical addresses corresponds to the logic addresses. When the memory controller 110 performs an erase operation on any NV memory element 122-$n$ within the plurality of NV memory elements 122-1, 122-2, ..., and 122-N (where "n" may represent any integer in the interval [1, N]), at least one block within multiple blocks of the NV memory element 122-$n$ may be erased. In addition, each block within the multiple blocks may comprise multiple pages (such as data pages), and an access operation (e.g. reading or writing) may be performed on one or more pages. In a read operation, the NV memory 120 may apply a reference voltage REF (which may be referred to as read reference voltage or read sensing voltage) to a set of memory cells to be read, to detect respective turn-on/turn-off states of the set of memory cells. Through adjusting a parameter, the NV memory 120 may adjust the reference voltage REF, and transmit the latest value of the parameter to the memory controller 110 as representative information of the reference voltage REF. The memory controller 110 may comprise a lookup table, in which the relationship between the reference voltage REF and the parameter is stored. When the representative information is obtained, the memory controller 110 (e.g. the MCSVM engine 115) may determine the latest value of the reference voltage REF according to the lookup table, to be a current reference voltage for performing machine learning and/or machine identification, but the present invention is not limited thereto. According to some embodiments, the memory controller 110 (e.g. the MCSVM engine 115) may perform calculation to determine the latest value of the reference voltage REF according to the latest value of the parameter, to be the current reference voltage, where the lookup table is not required. In a situation where a magnitude of the reference voltage REF corresponds to (e.g. is proportional to, and more particularly, equal to) a magnitude of a value of the parameter, the memory controller 110 (e.g. the MCSVM engine 115) may determine the latest value of the reference value REF directly according to the latest value of the parameter.

According to some embodiments, the architecture shown in FIG. 1 may vary. For example, the MCSVM engine 115 may be integrated into the control logic circuit 114. For another example, the MCSVM engine 115 may be implemented as a program code running on the microprocessor 112. For yet another example, the MCSVM engine 115 may be installed in the NV memory 120.

Figure 2:
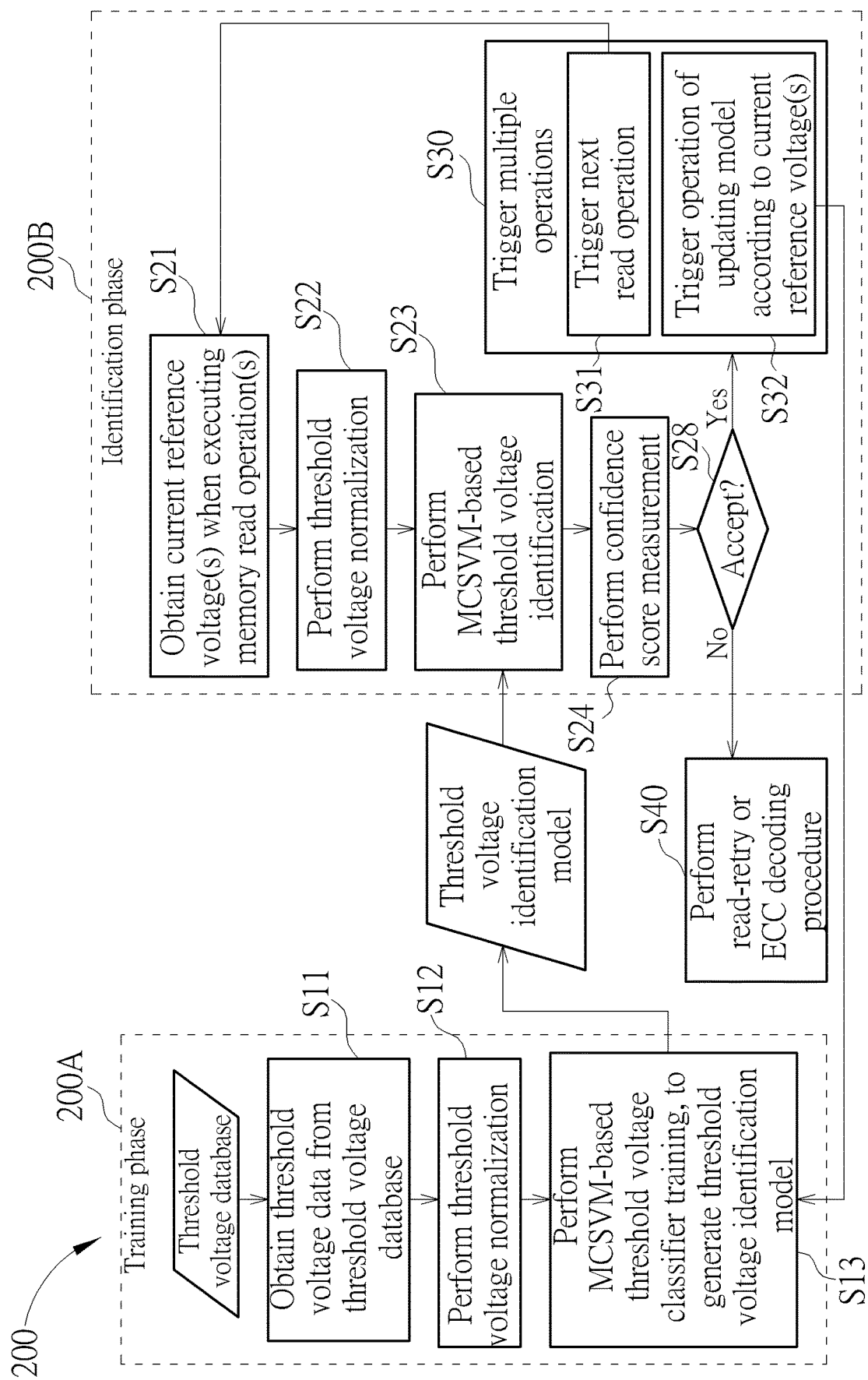
FIG. 2 is a workflow of a method for performing memory access management with aid of machine learning in memory device according to an embodiment of the present invention.

FIG. 2 is a workflow 200 of a method for performing memory access management with aid of machine learning in memory device according to an embodiment of the present invention. For better comprehension, Steps {S11, S12, S13} and {S21, S22, S23, S24, S28, S30} are illustrated in a training phase 200A and an identification phase 200B, respectively, but the present invention is not limited thereto. During the training phase 200A, the memory controller 110 (e.g. the MCSVM engine 115) may perform machine learning according to a predetermined database (such as a threshold voltage database) regarding a threshold voltage distribution, to generate at least one threshold voltage identification model (e.g. one or more threshold voltage identification models), where the aforementioned at least one threshold voltage identification model is utilized for determining bit information read from a memory cell of the NV memory 120. During the identification phase 200B, the memory controller 110 (e.g. the MCSVM engine 115) may obtain representative information of one or more reference voltages {REF} (which may be referred to as the reference voltages {REF}, for brevity) when reading the NV memory 120, for performing machine identification according to the aforementioned at least one threshold voltage identification model to generate read data, where the read data comprises the bit information.

Figure 3:
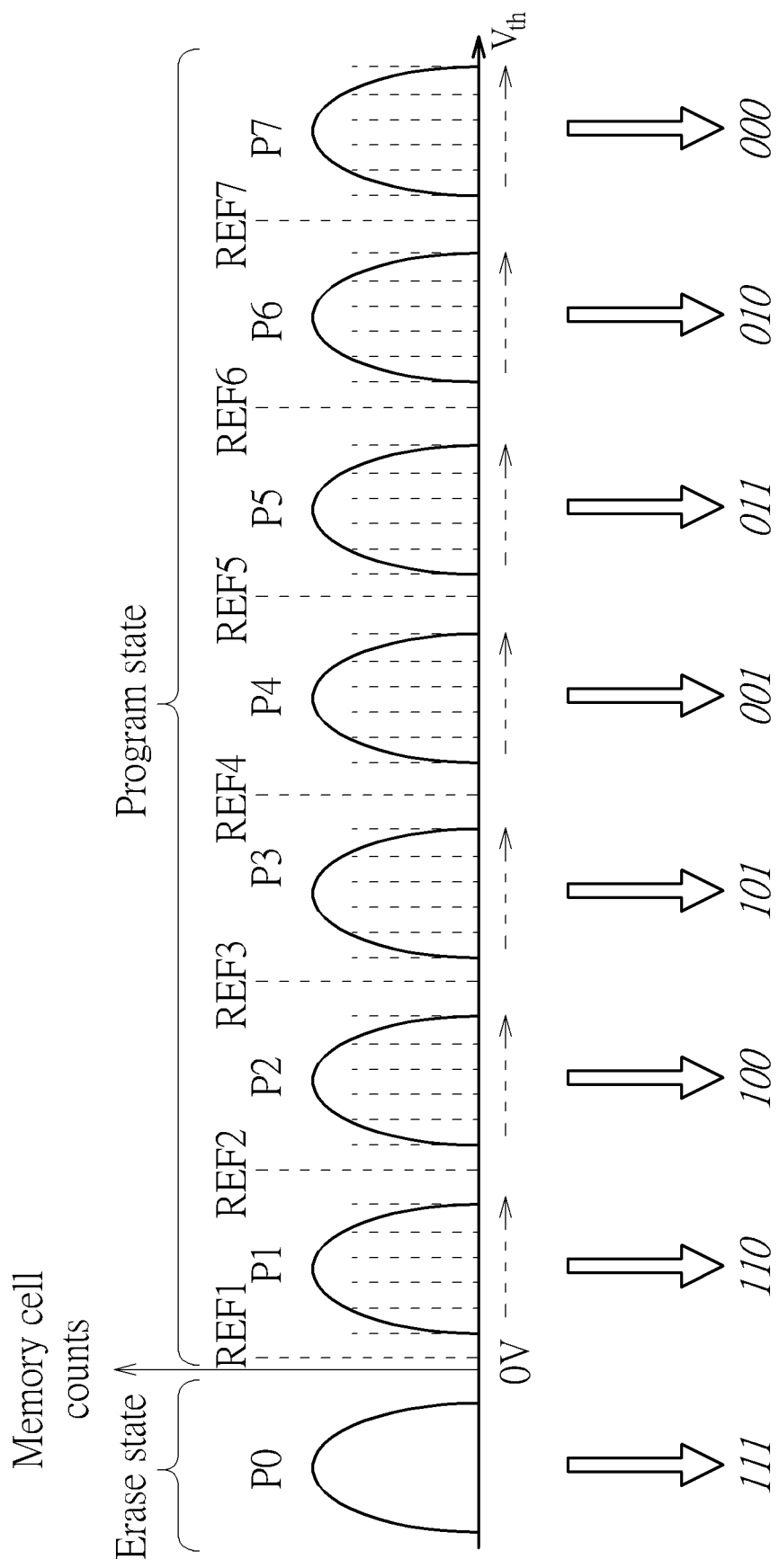
FIG. 3 illustrates reference voltages of the method according to an embodiment of the present invention.

In Step S11, the memory controller (e.g. the MCSVM engine 115) may obtain threshold voltage data from the threshold voltage database. The threshold voltage database may comprise multiple sets of voltage data obtained in advance, such as reference voltage distribution data obtained in the process of reading random data within one or more sample memories (which may be collectively referred to as the sample memory, for brevity). For example, the sample memory may represent a NV memory product having the same product model number as the NV memory 120, so the reference voltage distribution data may be a reference for machine learning in the memory device 100. For better comprehension, a triple level cell (TLC) Flash memory may be taken as an example of the NV memory 120, but the present invention is not limited thereto. FIG. 3 illustrates some reference voltages of the method according to an embodiment of the present invention, where the horizontal axis may represent threshold voltage $V_{th}$, and the vertical axis may represent memory cell counts. Curves respectively corresponding to states {P0, P1, P2, P3, P4, P5, P6, P7} may represent different memory states, which may represent bit information {111, 110, 100, 101, 001, 011, 010, 000}, where the state P0 may be regarded as an erase state, and any of the states {P1, P2, P3, P4, P5, P6, P7} may be regarded as a program state. The reference voltages (indicated by vertical dashed lines) shown in FIG. 3 comprise multiple candidate voltages of the reference voltage REF, and in different intervals (such as seven intervals for detecting the states {P1, P2, P3, P4, P5, P6, P7}), the reference voltage REF may be referred to as reference voltages {REF1, REF2, REF3, REF4, REF5, REF6, REF7}, respectively. The memory device 100 may utilize the reference voltage REF (such as {REF1, REF2, REF3, REF4, REF5, REF6, REF7}) as the threshold voltage $V_{th}$ to determine bit information of a read operation. When the sample memory has the same product model number as the NV memory 120, the reference voltage distribution data may be similar to distribution data of the curves respectively corresponding to the states {P0, P1, P2, P3, P4, P5, P6, P7}, and may be utilized for training the memory device 100 to perform machine learning in the memory device 100. According to this embodiment, as the reference voltage REF may be utilized as the threshold voltage $V_{th}$, the reference voltage distribution data may also be referred to as threshold voltage distribution data. Provided that enough valid data samples have been collected in the threshold voltage database and have been classified, the classified distribution data in the threshold voltage database may belong to multiple classes, respectively, such as 8 classes {CL(1), CL(2), CL(3), CL(4), CL(5), CL(6), CL(7), CL(8)} respectively corresponding to {000, 001, 010, 011, 100, 101, 110, 111}.

In Step S12, the memory controller 110 (e.g. the MCSVM engine 115) may perform threshold voltage normalization, and more particularly, may utilize multiple one-dimensional normal distribution probability density functions (PDF) to perform normalization on the multiple classes of distribution data, respectively, for being utilized as training data of machine learning. Through normalization, the MCSVM engine 115 may map original data (e.g. the threshold voltage distribution data) into a predetermined interval, to reduce complexity of machine learning and identification. For example, regarding any of the multiple classes, such as a target class, the MCSVM engine 115 may perform threshold voltage normalization according to the following equation:

$$f(x) = \frac{1}{\sigma\sqrt{2\pi}} e^{-\frac{(x-\mu)^2}{2\sigma^2}}$$

where "x" represents the threshold voltage value, "η" represents the threshold voltage average value of the target class, and "σ" represents the standard deviation of the target class. According to some embodiments, the MCSVM engine 115 may utilize a set of statistic value (x, μ, σ) as characteristic information of the target class, and more particularly, utilize multiple sets of statistic value {(x, μ, σ)} as characteristic information of multiple classes, respectively.

Figure 4:
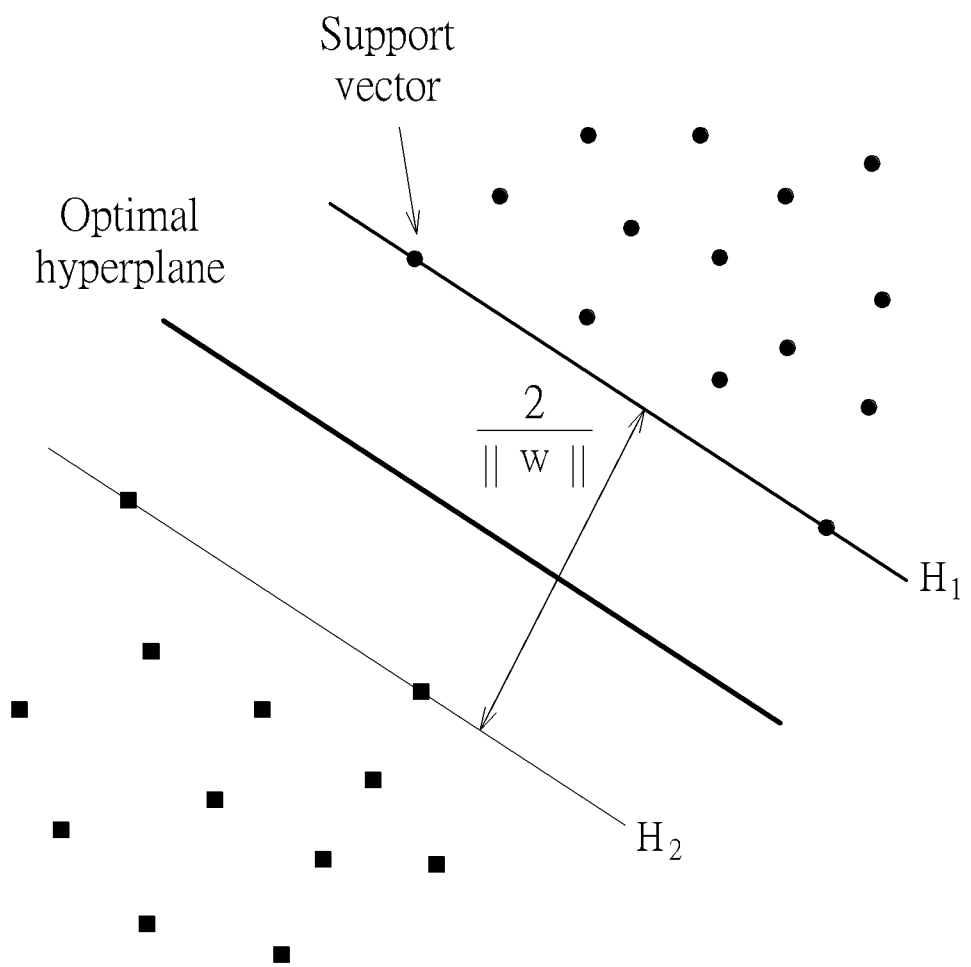
FIG. 4 illustrates detailed implementation of training phase shown in FIG. 2 according to an embodiment of the present invention.
Figure 5:
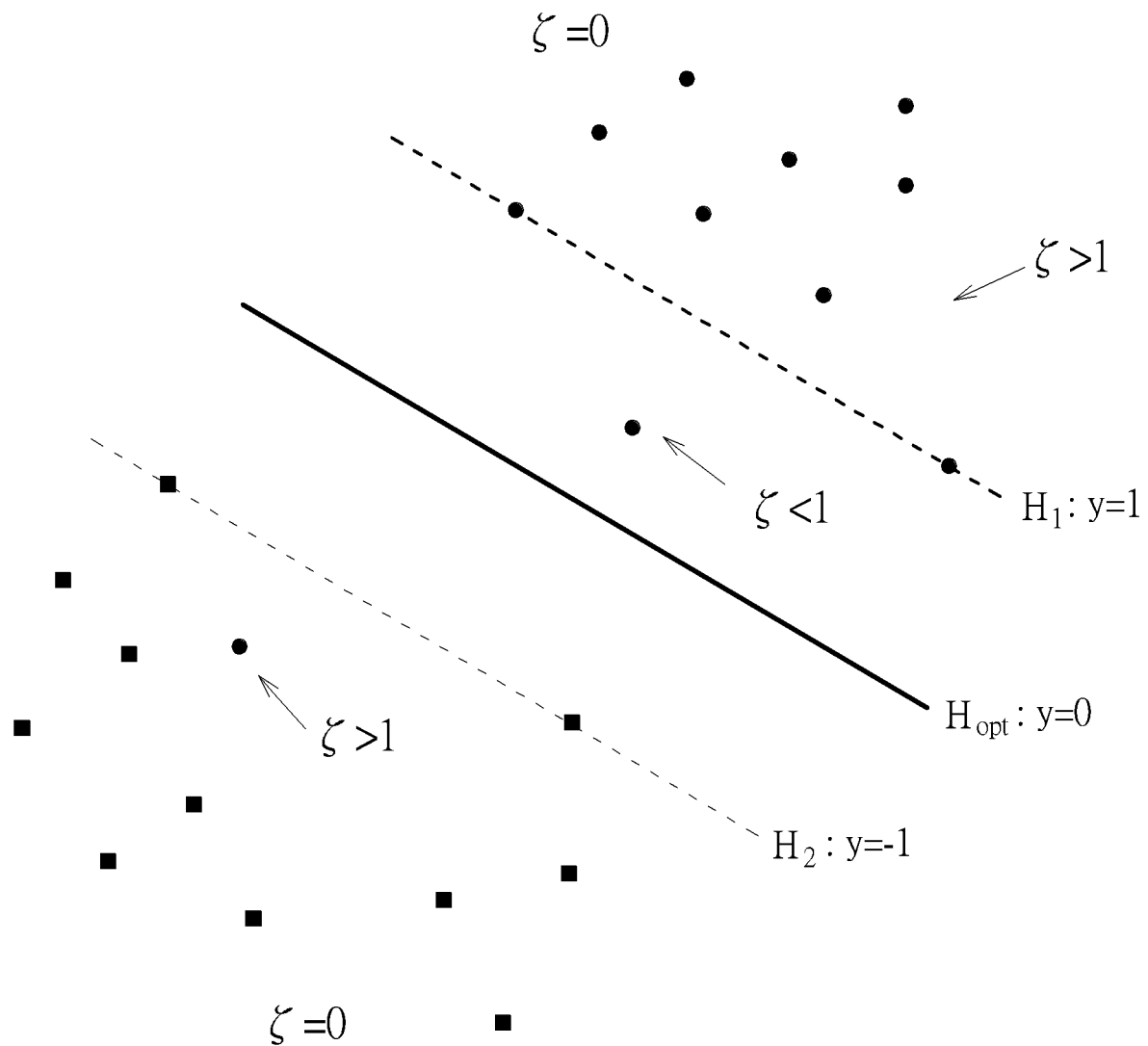
FIG. 5 illustrates detailed implementation of identification phase shown in FIG. 2 according to an embodiment of the present invention.

In Step S13, the memory controller 110 (e.g. the MCSVM engine 115) may perform MCSVM-based threshold voltage classifier training, to generate the aforementioned at least one threshold voltage identification model. The MCSVM engine 115 may operate according to a supervised machine learning method. After the threshold voltage normalization in Step S12 is completed, all voltage data within each class of the multiple classes may be referred to as vectors. Taking FIG. 4 as an example, in the training phase 200A, the MCSVM engine 115 may search for two separation lines between any two classes within the multiple classes, where the two separation lines may be referred to as support hyperplanes $H_1$ and $H_2$, and any set of data that is just located on a certain support hyperplane may be referred to as a support vector. Regarding these two classes, the MCSVM engine 115 may search for an optimal hyperplane, such as the optimal hyperplane $H_{opt}$ for performing classification in the phase 200B.

According to this embodiment, the MCSVM engine 115 may comprise a MCSVM classifier, where the operation thereof may be expressed as follows:

$$\min_{w,b,\xi} \frac{1}{2}\|w\|^2 + C\sum_{i=1}^{N}\xi_i \text{ and } y_i(w \cdot x_i - b) + \xi_i \geq 1, \xi \geq 0, \forall i$$

where "N" represents the total number of vectors, the index "i" may be a positive integer and vary within the interval [1, N], "$x_i$" represents a current vector corresponding to the index "i", "$y_i$" may be one of {−1, +1} to indicate the class which "$x_i$" belongs to, "w" represents a normal vector orthogonal (or perpendicular) to a hyperplane, "b" represents a bias term having constant value, "c" represent a penalty parameter having finite value, and "ξ" represents a nonnegative slack variable.

Regarding the optimal hyperplane $H_{opt}$, w·x+b=0 and "w" may be an N-dimensional vector (e.g. w ∈ $R^N$), and the MCSVM classifier may classify an unknown point "x" according to the following decision function f(x):

$$f(x) = \text{sign}(w \cdot x + b) = \text{sign}\left(\sum_{i=1}^{N_s} \alpha_i m_i x_i \cdot x\right)$$

where "$N_s$" represents the number of support vectors, the index "i" may be a positive integer and may vary within the interval [1, $N_s$], "$x_i$" represents a current vector corresponding to the index "i", "$\alpha_i$" represents a Lagrange multiplier, and $m_i \in \{-1, +1\}$, which may describe the class which "$x_i$" belongs to.

In most situations, searching for suitable hyperplane in an input space may be too restrictive and not practical. In order to solve this problem, the MCSVM engine 115 may map the input space into a higher-dimensional feature space such as a feature space with higher dimension, and search for the optimal hyperplane in the feature space. For example, the MCSVM engine 115 may utilize a kernel function $K(x_i, x_j)=\Phi(x_i)\Phi(x_j)$, where $\Phi(\cdot)$ may represent a mapping function utilized for mapping "$x_i$" into a high-dimensional space. Therefore, the decision function f(x) becomes:

$$f(x) = \text{sign}\left(\sum_{i=1}^{N_s} \alpha_i m_i K(x_i \cdot x) + b\right)$$

Thus, the aforementioned at least one threshold voltage identification model which has been built may comprise parameters (w, b, $\alpha_i$) of the decision function f(x) of the optimal hyperplane between respective classes. Assume that the multiple classes represent CLCNT classes, where the class count CLCNT may be a positive integer. The MCSVM engine 115 may obtain (CLCNT−1) sets of parameters (such as (w, b, $\alpha_i$) or {(w, b, $\alpha_i$)}) to be the aforementioned at least one threshold voltage identification model, and utilize the (CLCNT−1) sets of parameters to configure the MCSVM classifier as one or more corresponding classifiers, respectively, for distinguishing the CLCNT classes. For example, when CLCNT=2, the MCSVM engine 115 may obtain a set of parameters (w, b, $\alpha_i$) to be a threshold voltage identification model, and this set of parameters (w, b, $\alpha_i$) may configure the MCSVM classifier as corresponding classifier $C_1$ for distinguishing two classes; when CLCNT=4, the MCSVM engine 115 may obtain three sets of parameters {(w, b, $\alpha_i$)} to be three threshold voltage identification models, and these three sets of parameters {(w, b, $\alpha_i$)} may configure the MCSVM classifier as corresponding classifiers {$C_1, C_2, C_3$}, respectively, for distinguishing four classes; when CLCNT=8, the MCSVM engine 115 may obtain seven sets of parameters {(w, b, $\alpha_i$)} to be seven threshold voltage identification models, and these seven sets of parameters {(w, b, $\alpha_i$)} may configure the MCSVM classifier as corresponding classifiers {$C_1, C_2, C_3, C_4, C_5, C_6, C_7$}, respectively, for distinguishing eight classes; and the rest may be deduced by analogy.

In Step S21, the memory controller 110 (e.g. the MCSVM engine 115) may obtain current reference voltage(s) (e.g. one or more current reference voltages, such as the aforementioned reference voltages {REF}) when executing memory read operation(s) (which may be performed through one or more memory operation commands such as read commands to the NV memory 120). As a read operation is typically performed regarding a set of memory cells (rather than a single memory cell), the MCSVM engine 115 may obtain a set of representative information of the reference voltages {REF} from the NV memory 120. According to the lookup table, the MCSVM engine 115 may transform the set of representative information into the reference voltages {REF}, where the reference voltages {REF} may be regarded as a set of threshold voltages {$V_{th}$} that respectively indicate transitions between turn-on and turn-off states of respective memory cells within the set of memory cells.

In Step S22, the memory controller 110 (e.g. the MCSVM engine 115) may perform threshold voltage normalization, which is similar to the operation of Step S12. Through normalization, the MCSVM engine 115 may map original data (e.g. the current reference voltage(s) such as the reference voltages {REF}) into the predetermined interval, to reduce complexity of machine learning and identification.

In Step S23, according to the aforementioned at least one threshold voltage identification model, the memory controller 110 (e.g. the MCSVM engine 115) may perform MCSVM-based threshold voltage identification. The MCSVM engine 115 may input normalization data (e.g. a normalization version of the current reference voltage(s), such as a normalization version of the reference voltages {REF}) into the MCSVM classifier, to perform identification through classification operation to obtain identification result. After normalization in Step S22 is completed, the MCSVM engine 115 may start to utilize the classifier $C_1$ to perform classification, and more particularly, utilize the classifiers {$C_1, \ldots, C_{CLCNT-1}$} (e.g. corresponding decision functions {$f_1(x), \ldots, f_{CLCNT-1}(x)$}) one by one to perform classification. For better comprehension, assume that CLCNT=8. Regarding any voltage data (such as a normalization version of any of the reference voltages {REF}) of the normalization data, in which the aforementioned any voltage data may be referred to as vector x, the MCSVM engine 115 may sequentially utilize the classifiers {$C_1, C_2, C_3, C_4, C_6, C_6, C_7$} to perform the following classification operations, respectively:

($C_1$). when $f_1(x)=+1$, x belongs to the class CL(1), otherwise ($f_1(x)=-1$), x does not belong to the class CL(1);
($C_2$). when $f_2(x)=+1$, x belongs to the class CL(2), otherwise ($f_2(x)=-1$), x does not belong to the class CL(2);
($C_3$). when $f_3(x)=+1$, x belongs to the class CL(3), otherwise ($f_3(x)=-1$), x does not belong to the class CL(3);
($C_4$). when $f_4(x)=+1$, x belongs to the class CL(4), otherwise ($f_4(x)=-1$), x does not belong to the class CL(4);
($C_5$). when $f_5(x)=+1$, x belongs to the class CL(5), otherwise ($f_s(x)=-1$), x does not belong to the class CL(5);
($C_6$). when $f_6(x)=+1$, x belongs to the class CL(6), otherwise ($f_6(x)=-1$), x does not belong to the class CL(6);
($C_7$). when $f_7(x)=+1$, x belongs to the class CL(7), otherwise ($f_7(x)=-1$), x does not belong to the class CL(7), that is, x belongs to the class CL(8);

where when a certain classifier determines that x belongs to a certain class, the MCSVM engine 115 may skip the operation(s) of subsequent classifier(s) (if exist), but the present invention is not limited thereto. Some details of each of the classifier {$C_1, \ldots, C_{CLCNT-1}$} are described as follows. Assume that the voltage data (or x) will be classified to a class $CL_m$ (m ∈ {-1, +1}, which respectively correspond to two conditions {f(x)=-1, f(x)=+1}), and {$x_j$|j=1, 2, ...} represent corresponding feature vectors such as vectors within the aforementioned feature space. Regarding the class $CL_m$, the distance ratio $R(x_j)$ of the distance $d(x_j, H_{opt})$ between $x_j$ and the optimal hyperplane $H_{opt}$ to the margin distance may be expressed as follows:

$$R(x_j) = \frac{wx_j + b}{\|w\|} \bigg/ \frac{1}{\|w\|} = wx_j + b$$

In Step S24, regarding the current reference voltage(s) such as the reference voltages {REF}, the memory controller 110 (e.g. the MCSVM engine 115) may perform confidence score measurement, and more particularly, generate at least one confidence score such as $SCORE_{SVM}(CL_m|x_j)$, $SCORE_{KNN}(CL_m|x_j)$, and linear combination $SCORE(CL_m|x_j)$ thereof as follows:

$$SCORE_{SVM}(CL_m \mid x_j) = \frac{1}{1 + e^{-R(x_j)}}$$

$$SCORE_{KNN}(CL_m \mid x_j) = \frac{k_m^j}{k}$$

$$SCORE(CL_m \mid x_j) = \beta \cdot SCORE_{SVM} + (1 - \beta) \cdot SCORE_{KNN}$$

where "k" represents the number of training vectors conforming to a predetermined rule, "$k^j_m$" represents the number of vectors that belong to the class $CL_m$ within k training vectors, and "β" represents a weighting factor between 0 and 1. $SCORE_{SVM}(CL_m|x_j)$ may correspond to the probability that $x_j$ belongs to the class $CL_m$. Based on K Nearest Neighbor (KNN) rule, according to Euclidean distance measurement, regardless of classes, the MCSVM may select k training vectors that are nearest to the unknown feature vector $x_j$ from all training vectors (such as the vectors which are utilized in machine learning), and determine the number of vectors that belong to the class $CL_m$ within the k training vectors to be $k^j_m$, but does not classify $x_j$ into the class $CL_m$ when calculating the confidence score $SCORE_{KNN}(CL_m|x_j)$.

In Step S28, the memory controller 110 (e.g. the MVSVM engine 115) may check whether to accept the identification result or not, and more particularly, check whether the aforementioned at least one confidence score reaches a confidence score threshold value, to determine the correctness of the bit information. If the identification result is accepted, Step S30 is entered; otherwise, Step S40 is entered.

In Step S30, the memory controller 110 (e.g. the MCSVM engine 115) may trigger multiple operations, and more particularly, trigger a next read operation (in Step S31) and trigger the operation of updating model according to the current reference voltage(s) such as the reference voltages {REF} (in Step S32). When updating model is triggered, the MCSVM engine 115 may add the current reference voltage(s) into the predetermined database to update (e.g. expand) the predetermined database, and update the aforementioned at least one threshold voltage identification model according to the latest version of the predetermined database.

In Step S40, the memory controller 110 (e.g. the MCSVM engine 115) may perform read-retry or Error Correction Code (ECC) decoding procedure.

According to this embodiment, when performing machine identification, regarding the memory cell, the memory controller 110 (e.g. the MCSVM engine 115) may select a class from multiple classes (such as {CL(1), CL(2), CL(3), CL(4), CL(5), CL(6), CL(7), CL(8)}) and utilize a set of predetermined bits corresponding to the class as the bit information, where the set of predetermined bits are selected from multiple sets of predetermined bits (such as {000, 001, 010, 011, 100, 101, 110, 111}), and the multiple sets of predetermined bits correspond to the multiple classes, respectively. More particularly, the read data that the memory controller 110 generates during the identification phase 200B may comprise respective bit information read from multiple memory cells (such as the set of memory cells) of the NV memory 120, and the multiple memory cells comprises the memory cell.

According to some embodiments, under control of the memory controller 110, the memory device 100 may load the predetermined database from outside into the memory device 100 in advance, to store the predetermined database in the NV memory 120 and/or other memory. For example, a manufacturer of the memory device 100 may couple the memory device 100 to a production tool (which may be another host device), to allow the predetermined database being transmitted from the production tool to the memory device 100. For another example, a manufacturer of the electronic device 10 may obtain the predetermined database from the manufacturer of the memory device 100 for the host device 50 to read it, to allow the predetermined database being transmitted from the host device 50 to the memory device 100.

According to some embodiments, in a situation where the MCSVM engine 115 is installed in the NV memory 120, the MVSVM engine 115 may obtain the training data from the NV memory elements {122-1, 122-2, . . . , 122-N} and complete the aforementioned at least one threshold voltage identification model during the training phase 200A. During the identification phase 200B, the MVSVM engine 115 may perform adjustment on the reference voltages {REF} by itself and update the model in real time, and provide the read data to the memory controller 110.

According to some embodiments, in a situation where the MCSVM engine 115 is installed in the memory controller 110, the manufacturer of the NV memory 120 may provide Log Likelihood Ratio data to a controller manufacturer (e.g. a manufacturer of the memory controller 110) as reference, for the controller manufacturer to generate the predetermined database. The MCSVM engine 115 may complete the aforementioned at least one threshold voltage identification model during the training phase 200A, and determine the current reference voltage(s) such as the reference voltages {REF} (more particularly, transform the set of representative information into the reference voltages {REF} according to the lookup table, respectively) during the identification phase 200B, and may determine the read data directly according to the current reference voltage(s) and update the model in real time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing memory access management with aid of machine learning in a memory device, the memory device comprising a non-volatile (NV) memory, the NV memory comprising at least one NV memory element, the method comprising:

in the memory device, during a training phase, performing machine learning according to a predetermined database regarding a threshold voltage distribution, to generate at least one threshold voltage identification model, wherein the predetermined database comprises classified distribution data respectively belonging to multiple classes, the multiple classes respectively correspond to different values of bit information, and the at least one threshold voltage identification model is utilized for determining which class of the multiple classes voltage data of a memory cell of the NV memory belongs to, in order to determine a value of bit information read from the memory cell of the NV memory; and in the memory device, during an identification phase, obtaining representative information of one or more reference voltages when reading the NV memory, for performing machine identification according to the at least one threshold voltage identification model to generate read data, wherein the read data comprises the bit information.

2. The method of claim 1, wherein performing machine identification comprises:

regarding the memory cell, selecting a class from multiple classes and utilizing a set of predetermined bits corresponding to the class to be the bit information.

3. The method of claim 2, wherein the set of predetermined bits is selected from multiple sets of predetermined bits, and the multiple sets of predetermined bits correspond to the multiple classes, respectively.

4. The method of claim 1, wherein the read data comprises respective bit information read from multiple memory cells of the NV memory, and the multiple memory cells comprise the memory cell.

5. The method of claim 1, further comprising:

updating the at least one threshold voltage identification model according to the one or more reference voltages.

6. The method of claim 1, further comprising:

generating at least one confidence score regarding the one or more reference voltages; and checking whether the at least one confidence score reaches a confidence score threshold value, to determine correctness of the bit information.

7. The method of claim 1, wherein performing machine learning comprises:

performing Multi-Class Support Vector Machine (MCSVM)-based threshold voltage classifier training, to generate the at least one threshold voltage identification model.

8. The method of claim 7, wherein performing machine learning comprises:

according to the at least one threshold voltage identification model, performing MCSVM-based threshold voltage identification.

9. The method of claim 7, wherein the at least one threshold voltage identification model comprises at least one set of parameters, and performing machine learning further comprises:

utilizing the at least one set of parameters to configure a MCSVM classifier within the memory device as at least one corresponding classifier, for distinguishing between multiple classes.

10. The method of claim 9, wherein the at least one threshold voltage identification model comprises multiple threshold voltage identification models, and the at least one set of parameters comprises multiple sets of parameters respectively corresponding to the multiple threshold voltage identification models; and performing machine learning comprises:

utilizing the multiple sets of parameters to configure the MCSVM classifier as multiple corresponding classifiers, respectively, for distinguishing between the multiple classes.

11. A memory device, comprising:
a non-volatile (NV) memory, arranged to store information, wherein the NV memory comprises at least one NV memory element; and
a controller, coupled to the NV memory, arranged to control at least one operation of the memory device, wherein the controller comprises:
  a processing circuit, arranged to control the controller according to a command from a host device, to allow the host device to access the NV memory through the controller, wherein:
    during a training phase, the controller performs machine learning according to a predetermined database regarding a threshold voltage distribution, to generate at least one threshold voltage identification model, wherein the predetermined database comprises classified distribution data respectively belonging to multiple classes, the multiple classes respectively correspond to different values of bit information, and the at least one threshold voltage identification model is utilized for determining which class of the multiple classes voltage data of a memory cell of the NV memory belongs to, in order to determine a value of bit information read from the memory cell of the NV memory; and
    during an identification phase, the controller obtains representative information of one or more reference voltages when reading the NV memory, for performing machine identification according to the at least one threshold voltage identification model to generate read data, wherein the read data comprises the bit information.

12. The memory device of claim 11, wherein when performing machine identification, regarding the memory cell, the controller selects a class from multiple classes and utilizes a set of predetermined bits corresponding to the class to be the bit information.

13. The memory device of claim 12, wherein the set of predetermined bits is selected from multiple sets of predetermined bits, and the multiple sets of predetermined bits correspond to the multiple classes, respectively.

14. The memory device of claim 11, wherein the read data comprises respective bit information read from multiple memory cells of the NV memory, and the multiple memory cells comprise the memory cell.

15. The memory device of claim 11, wherein the controller updates the at least one threshold voltage identification model according to the one or more reference voltages.

16. The memory device of claim 11, wherein the controller generates at least one confidence score regarding the one or more reference voltages, and checks whether the at least one confidence score reaches a confidence score threshold value, to determine correctness of the bit information.

17. The memory device of claim 11, wherein the controller comprise a Multi-Class Support Vector Machine (MCSVM) engine; and when performing machine learning, the MCSVM engine performs MCSVM-based threshold voltage classifier training, to generate the at least one threshold voltage identification model.

18. The memory device of claim 17, wherein when performing machine identification, the MCSVM engine performs MCSVM-based threshold voltage identification according to the at least one threshold voltage identification model.

19. An electronic device comprising the memory device of claim 11, and further comprising:
the host device, coupled to the memory device, wherein the host device comprises:
  at least one processor, arranged to control operations of the host device; and
  a power supply circuit, coupled to the at least one processor, arranged to provide power to the at least one processor and the memory device;
wherein the memory device provides the host device with storage space.

20. A controller of a memory device, the memory device comprising the controller and a non-volatile (NV) memory, the NV memory comprising at least one NV memory element, the controller comprising:
  a processing circuit, arranged to control the controller according to a command from a host device, to allow the host device to access the NV memory through the controller, wherein:
    during a training phase, the controller performs machine learning according to a predetermined database regarding a threshold voltage distribution, to generate at least one threshold voltage identification model, wherein the predetermined database comprises classified distribution data respectively belonging to multiple classes, the multiple classes respectively correspond to different values of bit information, and the at least one threshold voltage identification model is utilized for determining which class of the multiple classes voltage data of a memory cell of the NV memory belongs to, in order to determine a value of bit information read from the memory cell of the NV memory; and
    during an identification phase, the controller obtains representative information of one or more reference voltages when reading the NV memory, for performing machine identification according to the at least one threshold voltage identification model to generate read data, wherein the read data comprises the bit information.

* * * * *